(12) United States Patent
Akhavain et al.

(10) Patent No.: US 6,543,880 B1
(45) Date of Patent: Apr. 8, 2003

(54) INKJET PRINTHEAD ASSEMBLY HAVING PLANARIZED MOUNTING LAYER FOR PRINTHEAD DIES

(75) Inventors: Mohammad Akhavain; Robert-Scott Melendrino Lopez, both of Escondido; Brian J. Keefe, La Jolla; Janis Horvath, San Diego; Joseph E. Scheffelin, Poway; David K. Mc Elfresh, San Diego, all of CA (US)

(73) Assignee: Hewlett-Packard Company, Fort Collins, CO (US)

(*) Notice: Subject to any disclaimer, the term of this patent is extended or adjusted under 35 U.S.C. 154(b) by 49 days.

(21) Appl. No.: 09/648,567

(22) Filed: Aug. 25, 2000

(51) Int. Cl.[7] ............................................. B41J 2/155
(52) U.S. Cl. ................................. 347/42; 347/13
(58) Field of Search ......................... 347/42, 13, 71, 347/19, 49, 40, 12, 15; 29/611; 156/299; 216/38, 52; 438/21

(56) References Cited

U.S. PATENT DOCUMENTS

| | | | |
|---|---|---|---|
| 4,369,154 A | 1/1983 | Dougherty | 264/63 |
| 5,016,023 A | 5/1991 | Chan et al. | 347/42 |
| 5,057,854 A | 10/1991 | Pond et al. | 347/42 |
| 5,079,189 A | 1/1992 | Drake et al. | 438/21 |
| 5,098,503 A * | 3/1992 | Drake | 156/299 |
| 5,160,945 A | 11/1992 | Drake | 347/42 |
| 5,343,227 A * | 8/1994 | Hirosawa et al. | 347/42 |
| 5,510,273 A * | 4/1996 | Quinn | 437/3 |
| 5,665,249 A | 9/1997 | Burke et al. | 347/42 |
| 5,696,544 A | 12/1997 | Komuro | 347/50 |
| 5,719,605 A | 2/1998 | Anderson et al. | 347/59 |
| 5,742,305 A | 4/1998 | Hackleman | 347/42 |
| 5,753,959 A * | 5/1998 | Quinn et al. | 257/43 |
| 5,755,024 A | 5/1998 | Drake et al. | 29/611 |
| 5,946,012 A | 8/1999 | Courian et al. | 347/63 |
| 6,325,488 B1 * | 12/2001 | Beerling et al. | 347/42 |

FOREIGN PATENT DOCUMENTS

EP    0913261 A2    5/1999

OTHER PUBLICATIONS

Allen, R., "Ink Jet Printing with Large Pagewide Arrays: Issues and Challenges", Recent Progress in Ink Jet Technologies II, pp. 114–120.
Copy of European Search Report having European Application No. EP 01306915 mailed on Feb. 27, 2002.

* cited by examiner

Primary Examiner—Lamson D. Nguyen

(57) ABSTRACT

A method of forming an inkjet printhead assembly includes providing a substrate, disposing a planarization layer on a face of the substrate such that a first surface of the planarization layer contacts the face of the substrate, mechanically planarizing a second surface of the planarization layer opposite the first surface, including reducing a thickness of at least a portion of the first planarization layer, and mounting a plurality of printhead dies on the second surface of the planarization layer.

52 Claims, 8 Drawing Sheets

INKJET PRINTHEAD ASSEMBLY HAVING PLANARIZED MOUNTING LAYER FOR PRINTHEAD DIES

CROSS-REFERENCE TO RELATED APPLICATIONS

This application is related to U.S. patent application Ser. No. 09/216,601, entitled "Inkjet Printing Apparatus with Ink Manifold" filed on Dec. 17, 1998, and related to U.S. patent application Ser. No. 09/216,606, entitled "Multilayered Ceramic Substrate Serving as Ink Manifold and Electrical Interconnection Platform for Multiple Printhead Dies" filed on Dec. 17, 1998, both assigned to the assignee of the present invention, and incorporated herein by reference. This application is related to U.S. patent application Ser. No. 08/959,376, entitled "Scalable Wide-Array Inkjet Printhead and Method for Fabricating Same" filed on Oct. 28, 1997, and U.S. patent application Ser. No. 09/648,565, entitled "Wide-Array Inkjet Printhead Assembly with Internal Electrical Routing System" filed on even date herewith, both assigned to the assignee of the present invention, and incorporated herein by reference.

THE FIELD OF THE INVENTION

The present invention relates generally to inkjet printheads, and more particularly to a wide-array inkjet printhead assembly.

BACKGROUND OF THE INVENTION

A conventional inkjet printing system includes a printhead and an ink supply which supplies liquid ink to the printhead. The printhead ejects ink drops through a plurality of orifices or nozzles and toward a print medium, such as a sheet of paper, so as to print onto the print medium. Typically, the orifices are arranged in one or more arrays such that properly sequenced ejection of ink from the orifices causes characters or other images to be printed upon the print medium as the printhead and the print medium are moved relative to each other.

In one arrangement, commonly referred to as a wide-array inkjet printing system, a plurality of individual printheads, also referred to as printhead dies, are mounted on a single substrate. As such, a number of nozzles and, therefore, an overall number of ink drops which can be ejected per second is increased. Since the overall number of drops which can be ejected per second is increased, printing speed can be increased with the wide-array inkjet printing system.

Mounting a plurality of printhead dies on a single substrate, however, requires precise alignment between the printhead dies. Misalignment between the printhead dies can adversely affect performance of the inkjet printing system. A variation in planarity of the substrate, for example, results in a variation of planarity among the printhead dies and, therefore, misalignment between the printhead dies. Unfortunately, a variation of planarity among the printhead dies can result in ink drop trajectory errors as well as pen-to-paper spacing problems which degrade print quality. In addition, mounting of a plurality of printhead dies on a single substrate requires a plurality of electrical connections between electrical contacts of the substrate and electrical contacts of the printhead dies.

Accordingly, a need exists for precisely mounting and aligning a plurality of printhead dies on a single substrate of a wide-array inkjet printhead assembly such that misalignment between the printhead dies is avoided while an integrity of electrical contacts of the substrate is maintained.

SUMMARY OF THE INVENTION

One aspect of the present invention provides a method of forming an inkjet printhead assembly. The method includes providing a substrate, disposing a first planarization layer on a first face of the substrate such that a first surface of the first planarization layer contacts the first face of the substrate, mechanically planarizing a second surface of the first planarization layer opposed to the first surface thereof, and mounting a plurality of printhead dies on the second surface of the first planarization layer. Mechanically planarizing the second surface of the first planarization layer includes reducing a thickness of at least a portion of the first planarization layer.

BRIEF DESCRIPTION OF THE DRAWINGS

FIG. 8A is a cross-sectional view of one embodiment of a substrate used in forming an inkjet printhead assembly according to the present invention;

FIG. 8B is a cross-sectional view illustrating one embodiment of a planarization layer disposed on the substrate of FIG. 8A;

FIG. 8C is a cross-sectional view illustrating the planarization layer of FIG. 8B after planarizing thereof;

FIG. 8D is a cross-sectional view illustrating one embodiment of a plurality of printhead dies mounted on the planarized planarization layer of FIG. 8C;

FIG. 8E is a cross-sectional view illustrating one embodiment of wire bond leads coupled to the printhead dies of FIG. 8D and a first end of conductive paths extending through the substrate, and one embodiment of I/O pins coupled to a second end of the conductive paths extending through the substrate;

FIG. 8F is a cross-sectional view illustrating one embodiment of encapsulation of the wire bond leads of FIG. 8E;

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. The inkjet printhead assembly and related components of the present invention can be positioned in a number of different orientations. As such, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
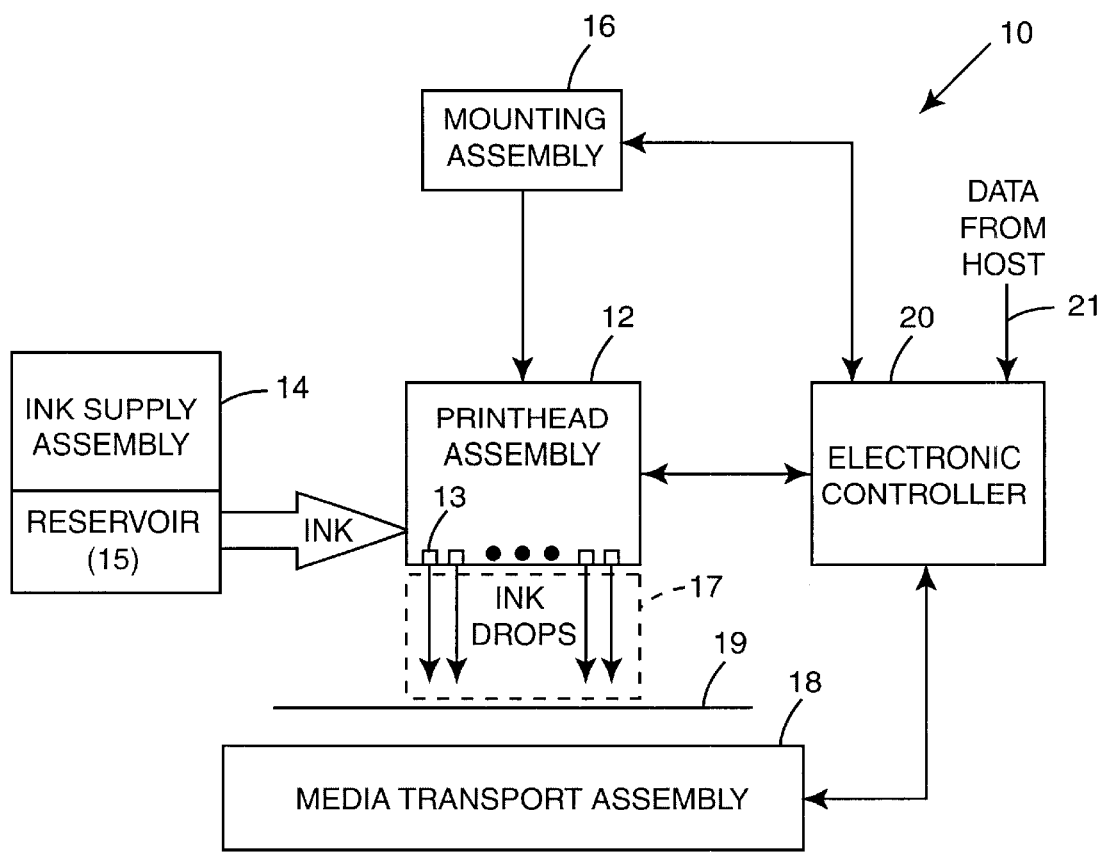
FIG. 1 is a block diagram illustrating one embodiment of an inkjet printing system according to the present invention.

FIG. 1 illustrates one embodiment of an inkjet printing system 10 according to the present invention. Inkjet printing system 10 includes an inkjet printhead assembly 12, an ink supply assembly 14, a mounting assembly 16, a media transport assembly 18, and an electronic controller 20. Inkjet printhead assembly 12 is formed according to an embodiment of the present invention, and includes one or more printheads which eject drops of ink through a plurality of orifices or nozzles 13 and toward a print medium 19 so as to print onto print medium 19. Print medium 19 is any type of suitable sheet material, such as paper, card stock, transparencies, Mylar, and the like. Typically, nozzles 13 are arranged in one or more columns or arrays such that properly sequenced ejection of ink from nozzles 13 causes characters, symbols, and/or other graphics or images to be printed upon print medium 19 as inkjet printhead assembly 12 and print medium 19 are moved relative to each other.

Ink supply assembly 14 supplies ink to printhead assembly 12 and includes a reservoir 15 for storing ink. As such, ink flows from reservoir 15 to inkjet printhead assembly 12. Ink supply assembly 14 and inkjet printhead assembly 12 can form either a one-way ink delivery system or a recirculating ink delivery system. In a one-way ink delivery system, substantially all of the ink supplied to inkjet printhead assembly 12 is consumed during printing. In a recirculating ink delivery system, however, only a portion of the ink supplied to printhead assembly 12 is consumed during printing. As such, ink not consumed during printing is returned to ink supply assembly 14.

In one embodiment, inkjet printhead assembly 12 and ink supply assembly 14 are housed together in an inkjet cartridge or pen. In another embodiment, ink supply assembly 14 is separate from inkjet printhead assembly 12 and supplies ink to inkjet printhead assembly 12 through an interface connection, such as a supply tube. In either embodiment, reservoir 15 of ink supply assembly 14 may be removed, replaced, and/or refilled. In one embodiment, where inkjet printhead assembly 12 and ink supply assembly 14 are housed together in an inkjet cartridge, reservoir 15 includes a local reservoir located within the cartridge as well as a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 16 positions inkjet printhead assembly 12 relative to media transport assembly 18 and media transport assembly 18 positions print medium 19 relative to inkjet printhead assembly 12. Thus, a print zone 17 is defined adjacent to nozzles 13 in an area between inkjet printhead assembly 12 and print medium 19. In one embodiment, inkjet printhead assembly 12 is a scanning type printhead assembly. As such, mounting assembly 16 includes a carriage for moving inkjet printhead assembly 12 relative to media transport assembly 18 to scan print medium 19. In another embodiment, inkjet printhead assembly 12 is a non-scanning type printhead assembly. As such, mounting assembly 16 fixes inkjet printhead assembly 12 at a prescribed position relative to media transport assembly 18. Thus, media transport assembly 18 positions print medium 19 relative to inkjet printhead assembly 12.

Electronic controller 20 communicates with inkjet printhead assembly 12, mounting assembly 16, and media transport assembly 18. Electronic controller 20 receives data 21 from a host system, such as a computer, and includes memory for temporarily storing data 21. Typically, data 21 is sent to inkjet printing system 10 along an electronic, infrared, optical or other information transfer path. Data 21 represents, for example, a document and/or file to be printed. As such, data 21 forms a print job for inkjet printing system 10 and includes one or more print job commands and/or command parameters.

In one embodiment, electronic controller 20 provides control of inkjet printhead assembly 12 including timing control for ejection of ink drops from nozzles 13. As such, electronic controller 20 defines a pattern of ejected ink drops which form characters, symbols, and/or other graphics or images on print medium 19. Timing control and, therefore, the pattern of ejected ink drops, is determined by the print job commands and/or command parameters. In one embodiment, logic and drive circuits forming a portion of electronic controller 20 are incorporated in inkjet printhead assembly 12. In another embodiment, the logic and drive circuits are located off inkjet printhead assembly 12.

Figure 2:
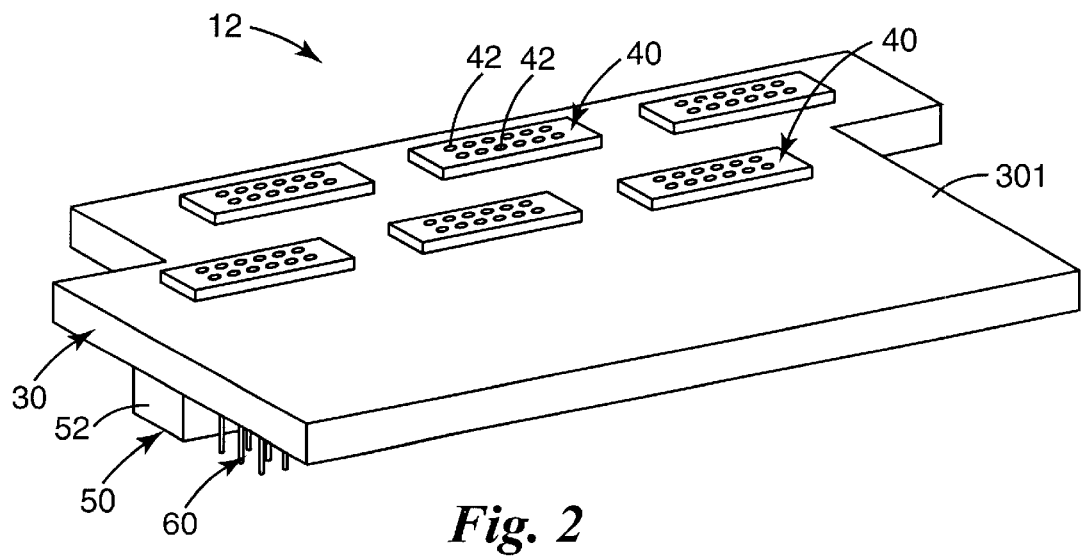
FIG. 2 is a top perspective view of one embodiment of an inkjet printhead assembly including a plurality of printhead dies according to the present invention.
Figure 3:
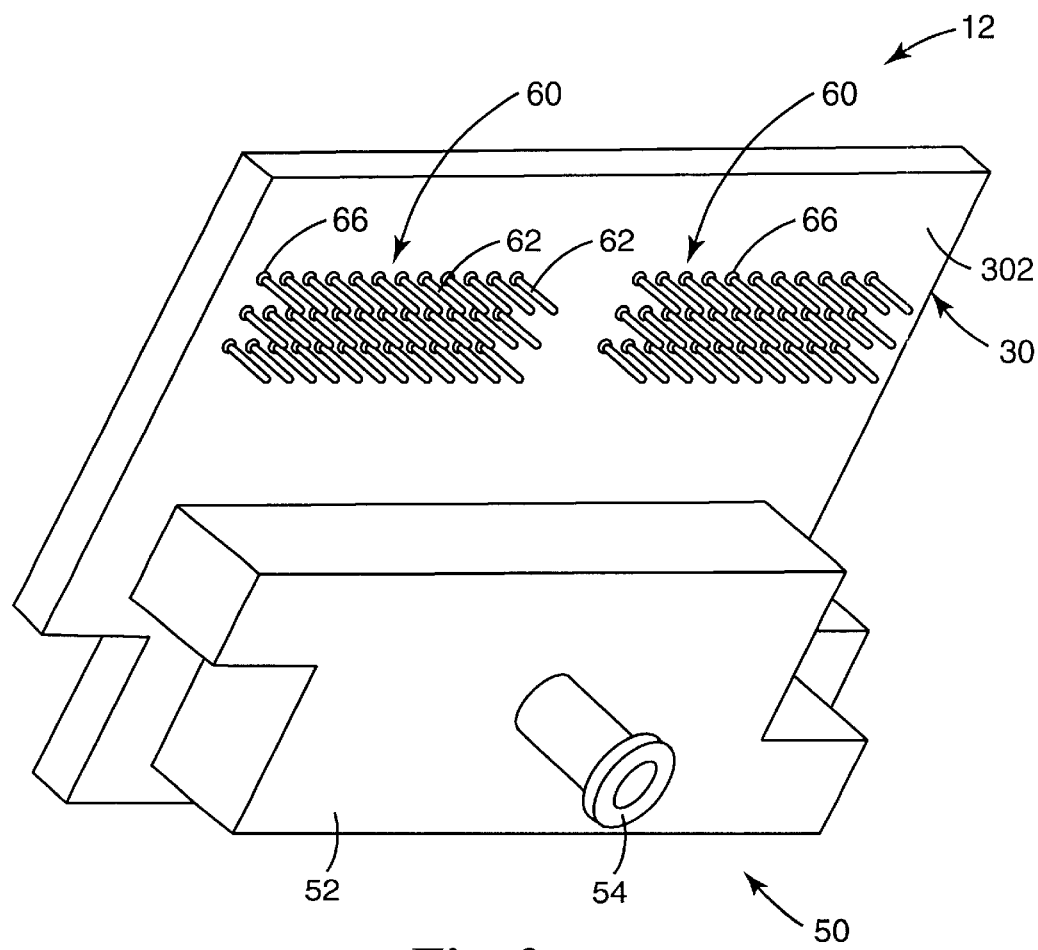
FIG. 3 is a bottom perspective view of the inkjet printhead assembly of FIG. 2.

FIGS. 2 and 3 illustrate one embodiment of a portion of inkjet printhead assembly 12. Inkjet printhead assembly 12 is a wide-array or multi-head printhead assembly and includes a carrier 30, a plurality of printhead dies 40, an ink delivery system 50, and an electronic interface system 60. Carrier 30 has an exposed surface or first face 301 and an exposed surface or second face 302 which is opposed to and oriented substantially parallel to first face 301. Carrier 30 serves to carry printhead dies 40 and provide electrical and fluidic communication between printhead dies 40, ink supply assembly 14, and electronic controller 20.

Printhead dies 40 are mounted on first face 301 of carrier 30 and aligned in one or more rows. In one embodiment, printhead dies 40 are spaced apart and staggered such that printhead dies 40 in one row overlap at least one printhead die 40 in another row. Thus, inkjet printhead assembly 12 may span a nominal page width or a width shorter or longer than nominal page width. In one embodiment, a plurality of inkjet printhead assemblies 12 are mounted in an end-to-end manner. Carrier 30, therefore, has a staggered or stair-step profile. Thus, at least one printhead die 40 of one inkjet printhead assembly 12 overlaps at least one printhead die 40 of an adjacent inkjet printhead assembly 12. While six printhead dies 40 are illustrated as being mounted on carrier 30, the number of printhead dies 40 mounted on carrier 30 may vary.

Ink delivery system 50 fluidically couples ink supply assembly 14 with printhead dies 40. In one embodiment, ink delivery system 50 includes a manifold 52 and a port 54. Manifold 52 is mounted on second face 302 of carrier 30 and distributes ink through carrier 30 to each printhead die 40. Port 54 communicates with manifold 52 and provides an inlet for ink supplied by ink supply assembly 14.

Electronic interface system 60 electrically couples electronic controller 20 with printhead dies 40. In one embodiment, electronic interface system 60 includes a plurality of input/output (I/O) pins 62. I/O pins 62 are mounted on second face 302 of carrier 30 and communicate electrical signals between electronic controller 20 and printhead dies 40 through carrier 30. In one embodiment, one or more I/O pins 62 may be replaced with I/O contact pads which contact electrical nodes (not shown) electrically coupled to electronic controller 20.

Figure 4:
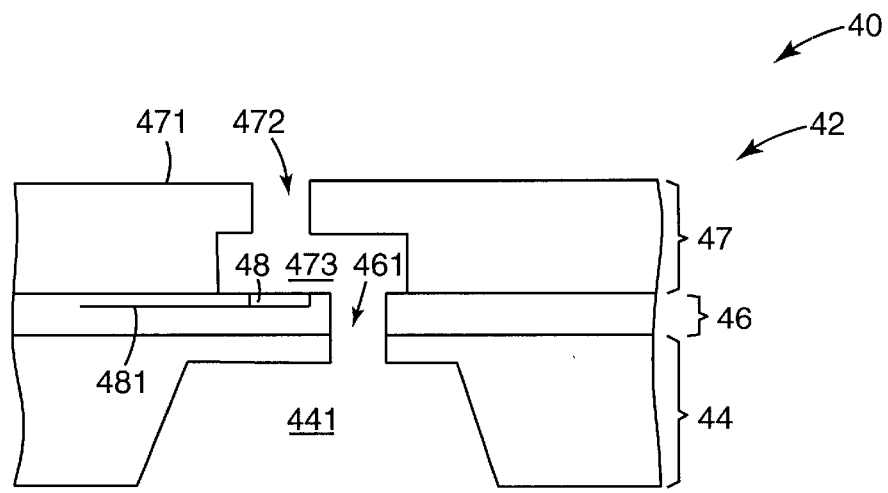
FIG. 4 is a cross-sectional view illustrating one embodiment of portions of a printhead die according to the present invention.

As illustrated in FIGS. 2 and 4, each printhead die 40 includes an array of printing or drop ejecting elements 42. Printing elements 42 are formed on a substrate 44 which has an ink feed slot 441 formed therein. As such, ink feed slot 441 provides a supply of liquid ink to printing elements 42. Each printing element 42 includes a thin-film structure 46, an orifice layer 47, and a firing resistor 48. Thin-film structure 46 has an ink feed channel 461 formed therein which communicates with ink feed slot 441 of substrate 44. Orifice layer 47 has a front face 471 and a nozzle opening 472 formed in front face 471. Orifice layer 47 also has a nozzle chamber 473 formed therein which communicates with nozzle opening 472 and ink feed channel 461 of thin-film structure 46. Firing resistor 48 is positioned within nozzle chamber 473 and includes leads 481 which electrically couple firing resistor 48 to a drive signal and ground.

During printing, ink flows from ink feed slot 441 to nozzle chamber 473 via ink feed channel 461. Nozzle opening 472 is operatively associated with firing resistor 48 such that droplets of ink within nozzle chamber 473 are ejected through nozzle opening 472 (e.g., normal to the plane of firing resistor 48) and toward a print medium upon energization of firing resistor 48.

Example embodiments of printhead dies 40 include a thermal printhead, a piezoelectric printhead, a flex-tensional printhead, or any other type of inkjet ejection device known in the art. In one embodiment, printhead dies 40 are fully integrated thermal inkjet printheads. As such, substrate 44 is formed, for example, of silicon, glass, or a stable polymer and thin-film structure 46 is formed by one or more passivation or insulation layers of silicon dioxide, silicon carbide, silicon nitride, tantalum, poly-silicon glass, or other suitable material. Thin-film structure 46 also includes a conductive layer which defines firing resistor 48 and leads 481. The conductive layer is formed, for example, by aluminum, gold, tantalum, tantalum-aluminum, or other metal or metal alloy.

Figure 5:
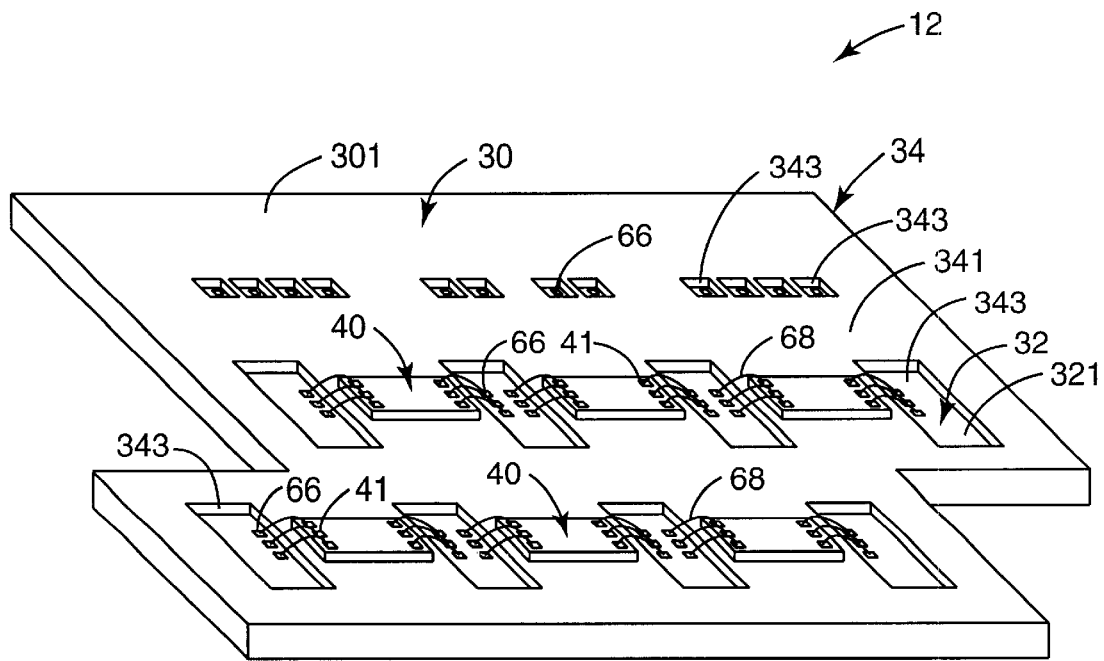
FIG. 5 is a top perspective view of one embodiment of a portion of an inkjet printhead assembly according to the present invention.
Figure 6:
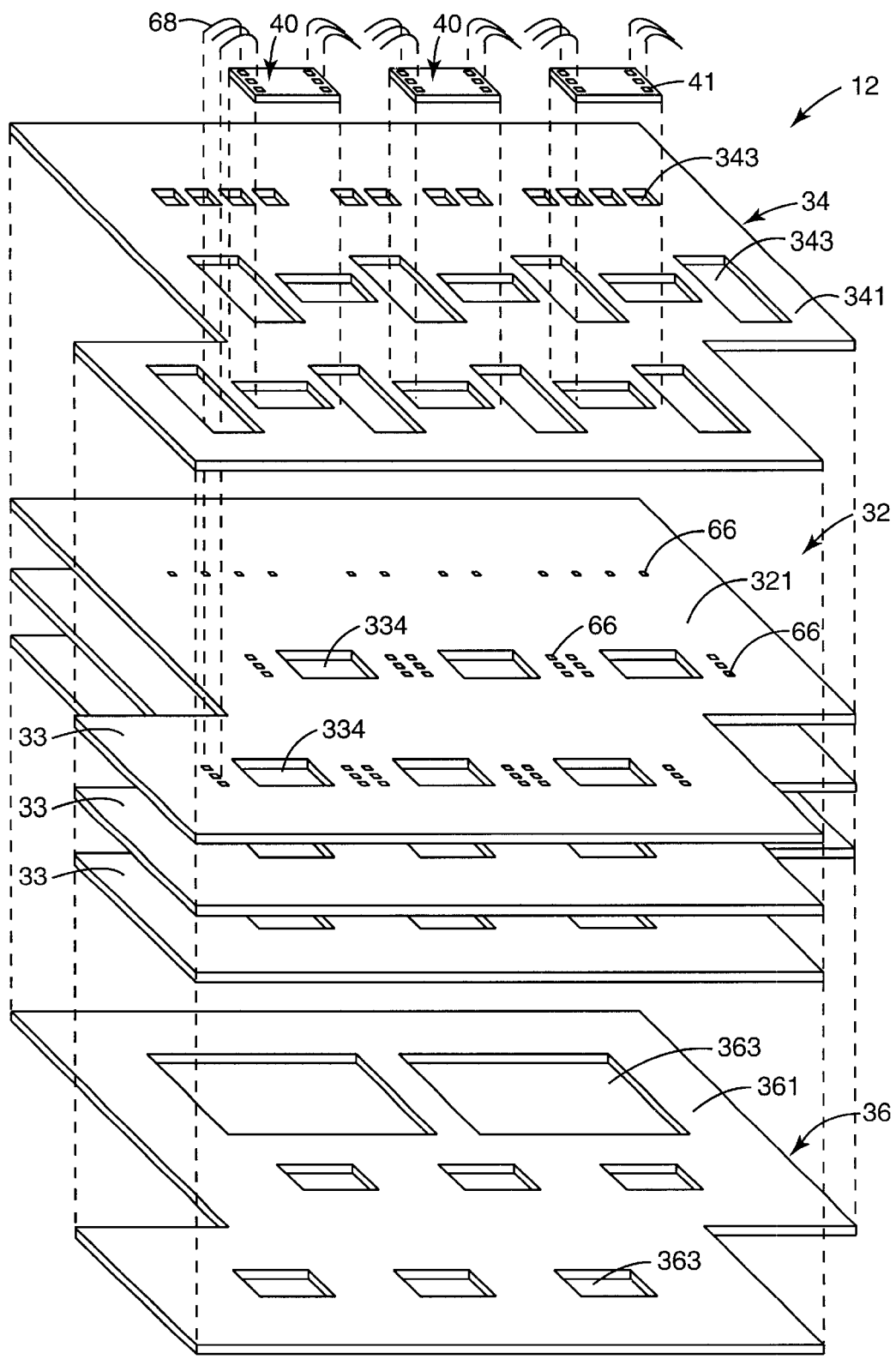
FIG. 6 is an exploded top perspective view of the inkjet printhead assembly of FIG. 5.
Figure 7:
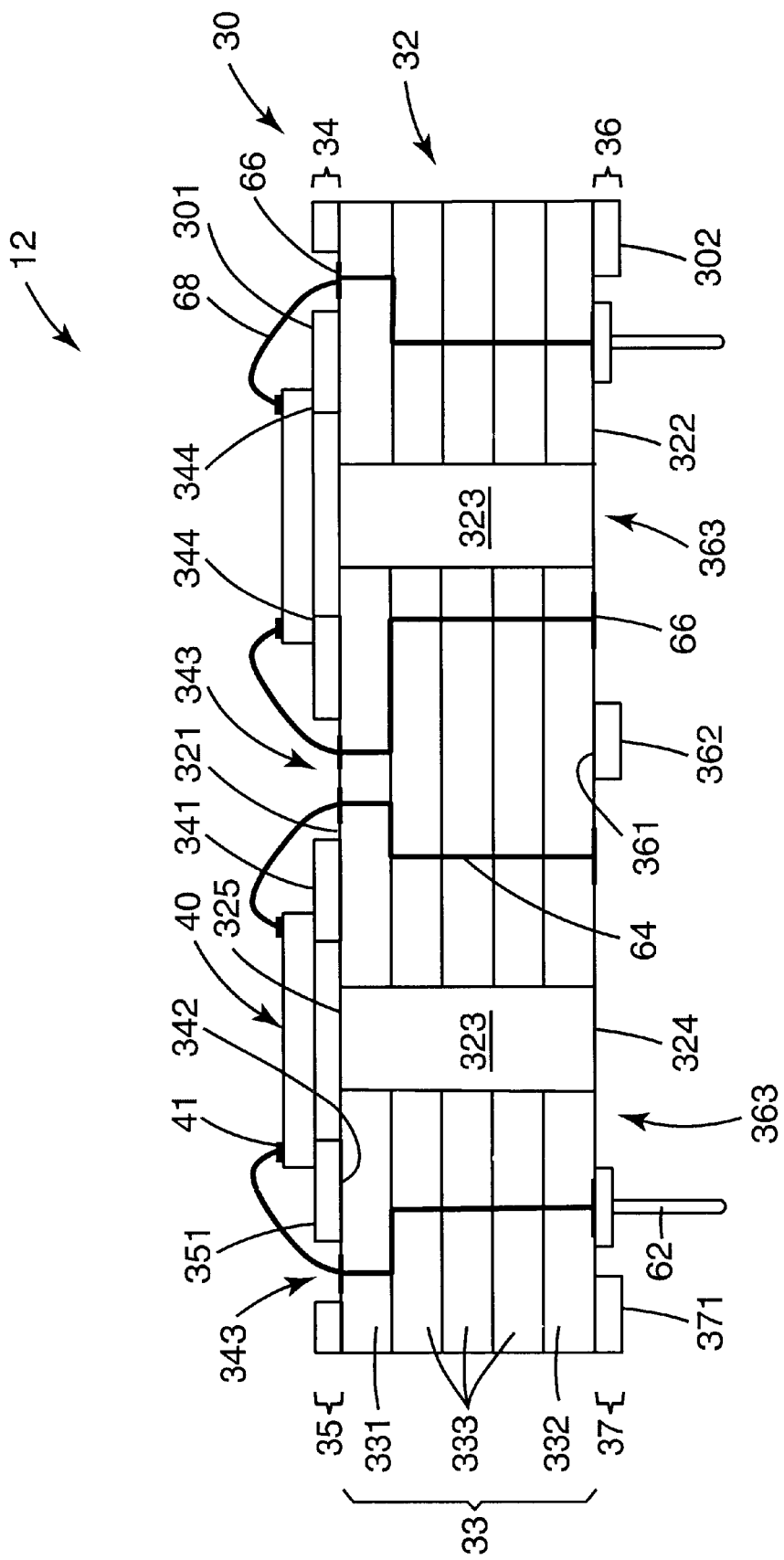
FIG. 7 is a schematic cross-sectional view of one embodiment of a portion of an inkjet printhead assembly according to the present invention.

Referring to FIGS. 5–7, carrier 30 includes a substrate 32, a mounting layer 34, and a supporting layer 36. Substrate 32 is generally rectangular in cross-section and includes a top face 321 and a bottom face 322 which is opposed to and oriented substantially parallel to top face 321. In one embodiment, substrate 32 provides electrical interconnection among printhead dies 40, electrical interconnection between printhead dies 40 and electronic controller 20 via electronic interface system 60, and fluidic communication between ink supply assembly 14 and printhead dies 40 via ink delivery system 50.

In one embodiment, substrate 32 is formed of a plurality of layers 33 including a top layer 331, a bottom layer 332, and at least one intermediary layer 333. Thus, a surface of top layer 331 constitutes top face 321 of substrate 32 and a surface of bottom layer 332 constitutes bottom face 322 of substrate 32. It is, however, within the scope of the present invention for substrate 32 to be formed of one unitary structure or, more specifically, one layer of material.

Mounting layer 34 has a top surface 341 and a bottom surface 342 which is opposed to top surface 341. Mounting layer 34 also has a plurality of openings 343 defined therein. Each opening 343 communicates with top surface 341 and bottom surface 342. Mounting layer 34 is disposed on top face 321 of substrate 32 such that bottom surface 342 of mounting layer 34 contacts top face 321 of substrate 32. As such, printhead dies 40 are mounted on top surface 341 of mounting layer 34.

Supporting layer 36 has a top surface 361 and a bottom surface 362 which is opposed to top surface 361. Supporting layer 36 also has a plurality of openings 363 defined therein. Each opening 363 communicates with top surface 361 and bottom surface 362. Supporting layer 36 is disposed on bottom face 322 of substrate 32 such that top surface 361 of supporting layer 36 contacts bottom face 322 of substrate 32. As such, carrier 30 is supported by supporting layer 36 when inkjet printhead assembly 12 is mounted within, for example, mounting assembly 16.

For transferring ink between ink supply assembly 14 and printhead dies 40, substrate 32 has a plurality of ink passages 323 formed therein. Ink passages 323 extend through substrate 32 and provide through-channels or through-openings for delivery of ink to printhead dies 40 from manifold 52. Thus, ink passages 323 communicate at a first end 324 with manifold 52 of ink delivery system 50 and at a second end 325 with printhead dies 40. More specifically, second end 325 of ink passages 323 communicates with ink feed slot 441 of substrate 44. As such, ink passages 323 form a portion of ink delivery system 50. Although only one ink passage 323 is shown for a given printhead die 40, there may be additional ink passages to the same printhead die to provide ink of respective differing colors.

In one embodiment, layers 33 of substrate 32 each have a plurality of openings 334 defined therein. Openings 334 in layers 33 communicate with associated openings 334 in adjacent layers 33 to form ink passages 323 in substrate 32. In addition, a number of openings 343 in mounting layer 34 communicate with openings 334 in layers 33 and a number of openings 363 in supporting layer 36 communicate with openings 334 in layers 33 for transferring ink between ink supply assembly 14 and printhead dies 40.

For transferring electrical signals between electronic controller 20 and printhead dies 40, substrate 32 has a plurality of conductive paths 64 extending therethrough and printhead dies 40 include electrical contacts 41 which form bond pads. As illustrated in FIG. 7, conductive paths 64 pass through at least one layer 33 of substrate 32 and terminate at exposed surfaces of substrate 32. As such, conductive paths 64 include input/output (I/O) pads 66 at terminal ends thereof which form electrical contacts or bond pads on substrate 32. Thus, I/O pads 66 provide a point for electrical connection to substrate 32 via, for example, I/O pins 62, wire bond leads 68, electrical nodes (not shown), and/or other suitable electrical connectors.

It is to be understood that FIG. 7 is a simplified schematic illustration of carrier 30. The illustrative routing of conductive paths 64 and ink passages 323 through substrate 32, for example, has been simplified for clarity of the invention. Conductive paths 64, for example, may be formed by conductive layers which are sandwiched between layers 33. Thus, layers 33 constitute insulative layers. As such, electrical coupling paths are provided between the conductive layers to provide electrical coupling between I/O pads 66 and I/O pins 62. Thus, I/O pads 66 are formed, for example, by a metallized layer disposed on an insulative layer such as top layer 331.

Although various features of carrier 30, such as conductive paths 64 and ink passages 323, are schematically illustrated as being straight, it is understood that design constraints could make the actual geometry more complicated for a commercial embodiment of printhead assembly 12. Ink passages 323, for example, may have more complicated geometries to allow multiple colorants of ink to be channeled through carrier 30. In addition, conductive paths 64 may have more complicated routing geometries through substrate 32 to avoid contact with ink passages 323 and to allow for electrical connector geometries different than the illustrated I/O pins 62. It is understood that such alternatives are within the scope of the present invention.

In one embodiment, conductive paths 64 terminate at top face 321 and bottom face 322 of substrate 32. Thus, I/O pads 66 are provided on top face 321 and bottom face 322 of substrate 32. As such, a number of openings 343 in mounting layer 34 reveal or provide access to I/O pads 66 provided on top face 321 of substrate 32 and a number of openings 363 in supporting layer 36 reveal or provide access to I/O pads 66 provided on bottom face 322 of substrate 32. In addition, a number of I/O pins 62 are electrically coupled at one end to I/O pads 66 provided on bottom face 322 and wire bond leads 68 are electrically coupled at one end to I/O pads 66 on top face 321 and at another end to electrical contacts 41 of printhead dies 40.

While conductive paths 64 terminate at top face 321 and bottom face 322 of substrate 32, it is, however, within the scope of the present invention for conductive paths 64 to terminate at side faces of substrate 32. In addition, one or more conductive paths 64 may branch from or lead to one or more other conductive paths 64. Furthermore, one or more conductive paths 64 may begin and end within one layer 33 of substrate 32.

In one embodiment, substrate 32 is formed of a ceramic, silicon, or suitable non-metallic material. Preferably, substrate 32 has a coefficient of thermal expansion approximating that of silicon, is able to receive solder and interconnect layers, and is able to receive mounting of integrated circuits. In addition, substrate 32 includes circuit patterns which pierce layers 33 to form conductive paths 64. In one fabrication methodology, circuit patterns are formed in layers of unfired tape (referred to as green sheet layers) using a screen printing process. The green sheet layers are made of ceramic particles in a polymer binder. Alumina may be used for the particles, although other oxides or various glass/ceramic blends may be used. Each green sheet layer receives conductor lines and other metallization patterns as needed to form conductive paths 64. Such lines and patterns are formed with a refractory metal, such as tungsten, by screen printing on the corresponding green sheet layer. Thus, conductive and non-conductive or insulative layers are formed in substrate 32.

Conductive paths 64 extend from one layer to the next through via holes punched out from the green sheet and filled in, for example, with a tungsten paste. Thus, circuit patterns including metallized or conductive layers are formed in substrate 32. Openings in substrate 32, such as ink passages 323, are formed by punching holes and cavities of desired size and shape through the green sheet. Once each layer 33 has received the desired metallization, vias, and openings, layers 33 are stacked in the desired configuration.

In one embodiment, mounting layer 34 is a planarized layer 35 and top surface 341 is a planed surface 351. More specifically, top surface 341 is a mechanically planarized surface. Thus, top surface 341 is substantially planar over an entire area thereof. As such, top surface 341 establishes a plurality of datum points 344 each lying in substantially one plane.

Datum points 344 facilitate precise mounting of and alignment between printhead dies 40 when printhead dies 40 are mounted on carrier 30. As such, each printhead die 40 contacts a number of datum points 344 when mounted on carrier 30. Thus, printhead dies 40 are precisely aligned relative to each other. More specifically, front face 471 of orifice layer 47 of each printing element 42 lies in substantially one plane. Planarized layer 35 and planed surface 351 are formed, for example, by grinding and/or lapping as described below.

In one embodiment, supporting layer 36 is a planarized layer 37 and bottom surface 362 is a planed surface 371. More specifically, bottom surface 362 is a mechanically planarized surface. Thus, bottom surface 362 is substantially planar over an entire area thereof. Planarized layer 37 and planed surface 371 are also formed, for example, by grinding and/or lapping as described below.

Figure 8A:
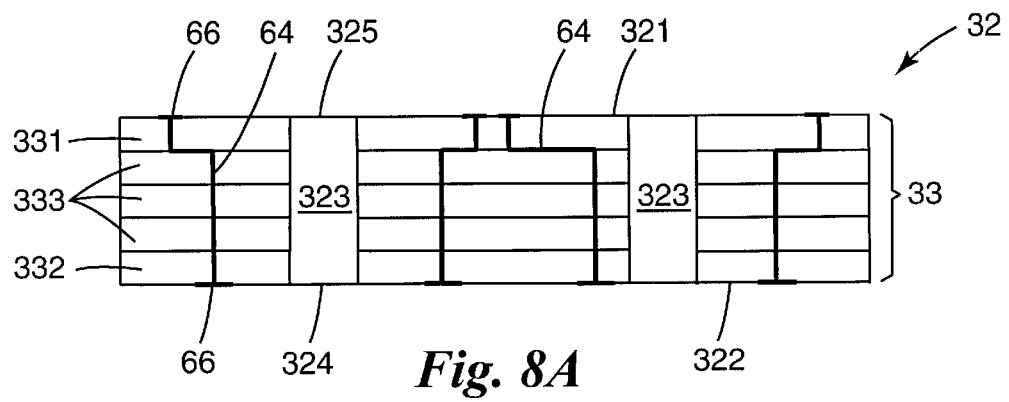
FIGS. 8A–8F illustrate one embodiment of a method of forming a portion of an inkjet printhead assembly according to the present invention.

FIGS. 8A–8F illustrate one embodiment of a method of forming inkjet printhead assembly 12. To form inkjet printhead assembly 12, substrate 32 is provided, as illustrated in FIG. 8A. Substrate 32 includes layers 33 and has ink passages 323 and conductive paths 64 extending therethrough. Substrate 32 is formed by stacking bottom layer 332, intermediary layers 333, and top layer 331. Bottom layer 332, intermediary layers 333, and top layer 331 include circuit patterns and openings, as described above. As such, ink passages 323 and conductive paths 64 are formed in substrate 32 when layers 33 are stacked in the desired configuration. In addition, I/O pads 66 are provided at exposed terminal ends of conductive paths 64.

Figure 8B:
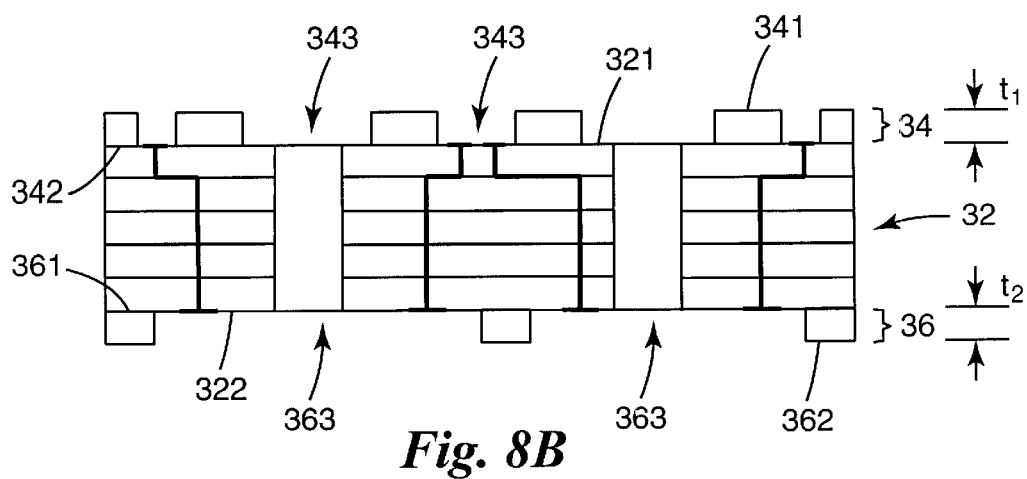

Next, as illustrated in FIG. 8B, mounting layer 34 and supporting layer 36 are disposed on top face 321 and bottom face 322, respectively, of substrate 32 to form carrier 30. Accordingly, a number of openings 343 in mounting layer 34 communicate with ink passages 323 in substrate 32 and a number of openings 343 in mounting layer 34 reveal conductive paths 64 terminating at and I/O pads 66 provided on top face 321 of substrate 32. In addition, a number of openings 363 in supporting layer 36 communicate with ink passages 323 in substrate 32 and a number of openings 363 in supporting layer 36 reveal conductive paths 64 terminating at and I/O pads 66 provided on bottom face 322 of substrate 32. Thus, I/O pads 66 and ends 324 and 325 of ink passages 323 are recessed relative to first face 301 and second face 302 of carrier 30. As such, carrier 30, including substrate 32, mounting layer 34, and supporting layer 36, is laminated under pressure and then fired or cosintered so as to create a monolithic structure having a three dimensional electrical and fluidic routing system therein.

One problem with such a structure formed of multiple layers of varying materials is that warpage and/or bowing of substrate 32, mounting layer 34, and/or supporting layer 36 may occur during the fabrication of carrier 30. The varying materials which form, for example, substrate 32, mounting layer 34, and supporting layer 36, may have varying coefficients of thermal expansion which cause relative expansion and/or contraction at differing rates while carrier 30 is being formed. In addition, there may also be waviness and/or other inherent variations in substrate 32, mounting layer 34, and/or supporting layer 36 which effect planarity of mounting layer 34 and/or supporting layer 36.

Figure 8C:
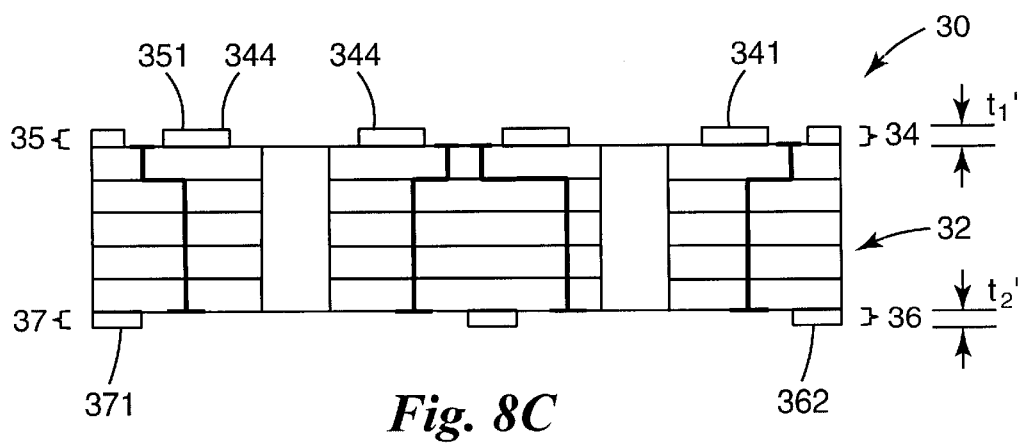

To provide a planar layer for the mounting of printhead dies 40, mounting layer 34 and supporting layer 36 are planed, as illustrated in FIG. 8C. More specifically, top surface 341 of mounting layer 34 and bottom surface 362 of supporting layer 36 are mechanically planarized so as to form a substantially planar surface over an entire area of top surface 341 and bottom surface 362, respectively. Mechanically planarizing top surface 341 of mounting layer 34 establishes datum points 344 which each lie in substantially one plane.

In one embodiment, mechanically planarizing mounting layer 34 and supporting layer 36 includes grinding and/or lapping top surface 341 and bottom surface 362. By grinding and/or lapping top surface 341 and bottom surface 362, a thickness of at least a portion of mounting layer 34 and supporting layer 36 is reduced. Top surface 341 and bottom surface 362 are ground and/or lapped until a desired flatness over an entire area of top surface 341 and bottom surface 362 is achieved.

In one illustrative embodiment, mounting layer 34 is reduced from an initial thickness $t_1$ to a final thickness $t_1'$ and supporting layer 36 is reduced from an initial thickness $t_2$ to a final thickness $t_2'$ as a result of being mechanically planarized. If there is any initial warpage and/or bowing of carrier 30, it is preferable that a difference between, for example, initial thickness $t_1$ and final thickness $t_1'$ (or $t_1-t_1'$) of mounting layer 34 be at least equal to a maximum range of non-planarity of top surface 341 prior to grinding and/or lapping. Thus, it is preferable that initial thickness $t_1$ of mounting layer 34 (or initial thickness $t_2$ of supporting layer 36) exceed any such range of non-planarity.

In one illustrative embodiment, a suitable thickness of carrier 30, including substrate 32, mounting layer 34, and supporting layer 36, before mechanically planarizing mounting layer 34 and supporting layer 36, is approximately 0.096+/−0.010 inches. In this illustrative embodiment, a suitable thickness for carrier 30, including substrate 32, mounting layer 34, and supporting layer 36, after mechanically planarizing mounting layer 34 and supporting layer 36, is approximately 0.096+/−0.002 inches. In one illustrative embodiment, a suitable final thickness $t_1'$ for mounting layer 34 is approximately 0.008 inches and a suitable final thickness $t_2'$ for supporting layer 36 is approximately 0.008 inches. While final thickness $t_1'$ and final thickness $t_2'$ are illustrated as being substantially equal, it is within the scope of the present invention for final thickness $t_1'$ and final thickness $t_2'$ to be unequal.

Since I/O pads 66 are provided on top face 321 and bottom face 322 of substrate 32, an integrity of I/O pads 66 is maintained as top surface 341 of mounting layer 34 and bottom surface 362 of supporting layer 36 are mechanically planarized. In addition, since ends 324 and 325 of ink passages 323 communicate with top face 321 and bottom face 322 of substrate 32, an integrity of ink passages 323 is also maintained as top surface 341 of mounting layer 34 in bottom surface 362 of supporting layer 36 are mechanically planarized.

Figure 8D:
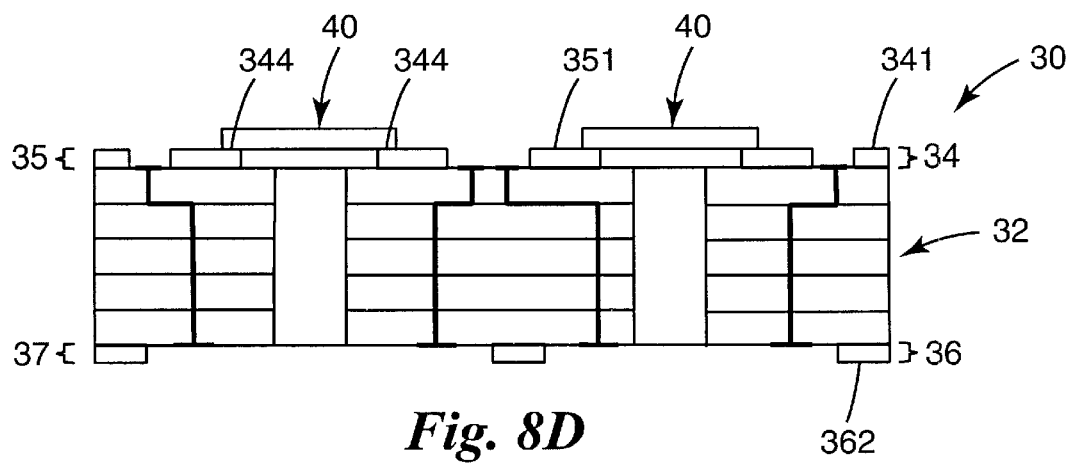

Next, as illustrated in FIG. 8D, printhead dies 40 are mounted on top surface 341 of mounting layer 34. When printhead dies 40 are mounted on top surface 341, each printhead die 40 contacts a number of datum points 344. Thus, precise alignment between printhead dies 40 is achieved. As such, front face 471 of orifice layer 47 of each printhead die 40 lies in substantially one plane.

Figure 8E:
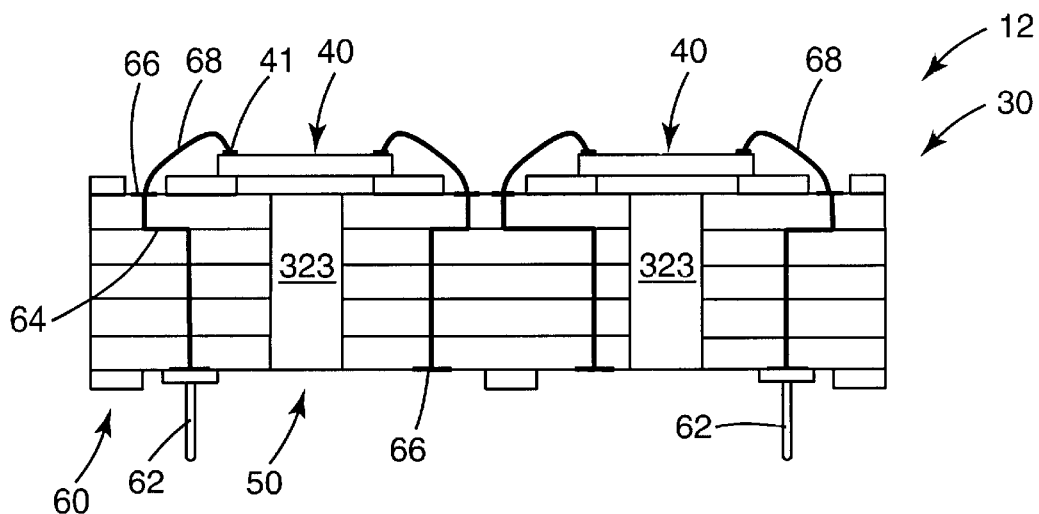

Then, as illustrated in FIG. 8E, electrical connectors such as wire bond leads 68 and/or I/O pins 62 are joined to I/O pads 66. Wire bond leads 68, for example, are joined at one end to I/O pads 66 provided on top face 321 of substrate 32 and at an opposite end to electrical contacts 41 of printhead dies 40. In addition, I/O pins 62, for example, are joined at one end to I/O pads 66 provided on bottom face 321 of substrate 32. A number of I/O pads 66 may provide contact points for electrical nodes (not shown) and, as such, may not include electrical connectors. Metal parts, such as I/O pins 62, are attached with a molten brazing process, for example, silver-copper eutectic brazing or a pure silver brazing. It is understood that other techniques for electrically coupling I/O pads 66 and electrical contacts 41 may be used including, for example, Tape Automated Bonding (TAB) which employs a circuit of multiple wires supported by a flexible band.

Figure 8F:
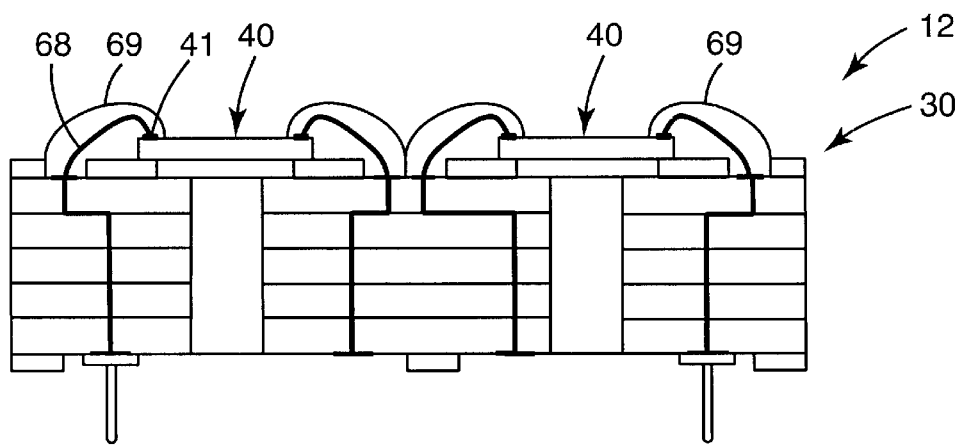

Thereafter, as illustrated in FIG. 8F, wire bond leads 68 are encapsulated. Thus, an integrity of electrical connections between wire bond leads 68, I/O pads 66, and electrical contacts 41 of printheads 40 is maintained.

Figure 9A:
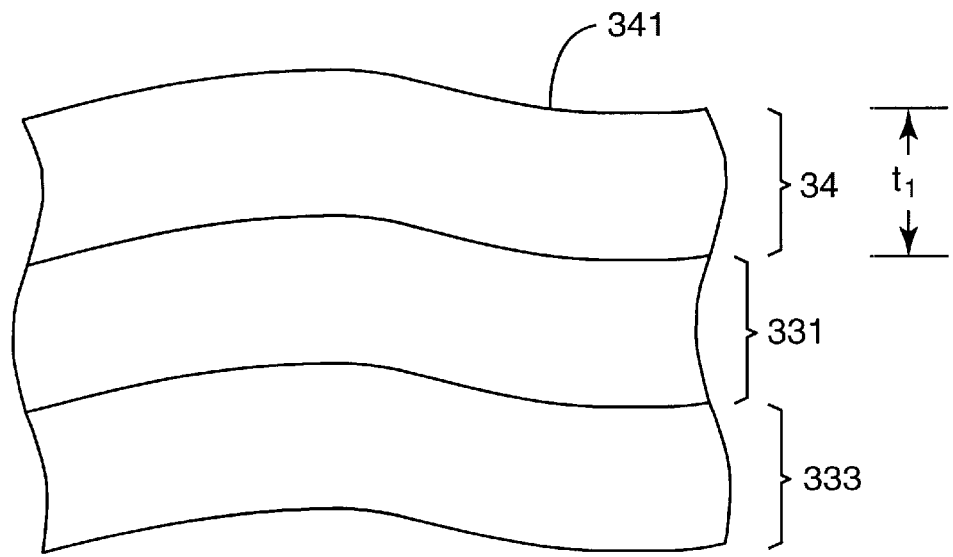
FIG. 9A is an enlarged portion of one embodiment of an inkjet printhead assembly including a planarization layer prior to planarizing thereof.
Figure 9B:
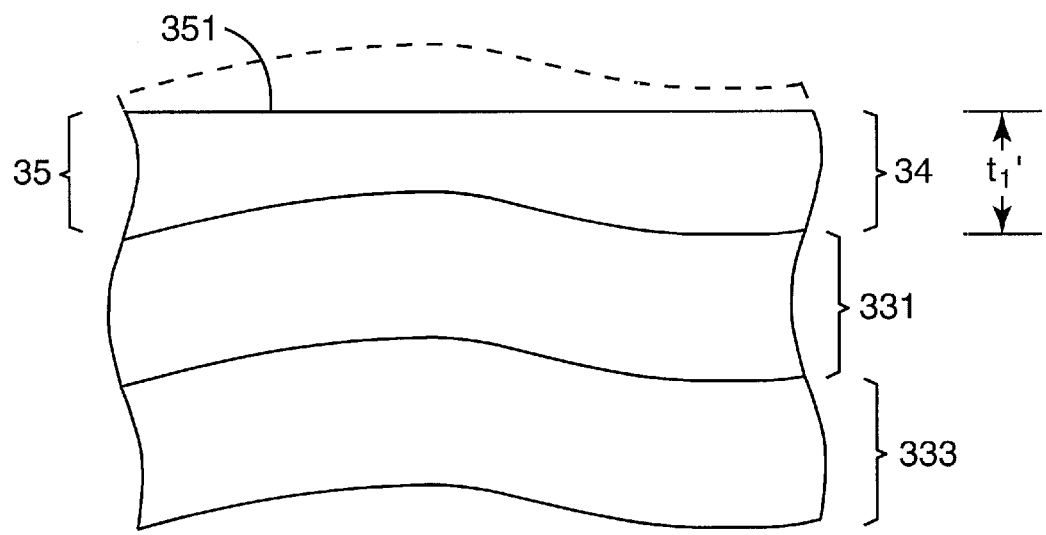
FIG. 9B is an enlarged portion of the inkjet printhead assembly of FIG. 9A including the planarization layer after planarizing thereof.

FIGS. 9A and 9B illustrate one exemplary embodiment of an enlarged portion of carrier 30 prior to and after planarization of mounting layer 34. FIG. 9A illustrates an enlarged portion of mounting layer 34 and an enlarged portion of substrate 32, including top layer 331 and intermediary layer 333, prior to planarization of mounting layer 34. As illustrated in FIG. 9A, mounting layer 34 and substrate 32 exhibit warpage and/or bowing resulting, for example, from manufacture of carrier 30 and/or other inherent characteristics as described above. It is understood that the extent of warpage and/or bowing of mounting layer 34 and substrate 32 illustrated in FIG. 9A has been exaggerated for clarity of the invention.

As a result of such warpage and/or bowing, top surface 341 of mounting layer 34 is not substantially planar over an entire area thereof. Top surface 341, therefore, does not present a desirable mounting surface for printhead dies 40. Mounting of printhead dies 40 on such a surface would result in a variation of planarity among printhead dies 40 and, more specifically, misalignment between printhead dies 40. Unfortunately, a variation of planarity among printhead dies 40 can result in ink drop trajectory errors as well as pen-to-paper spacing problems which degrade print quality.

FIG. 9B illustrates an enlarged portion of mounting layer 34 and an enlarged portion of substrate 32, including top layer 331 and intermediary layer 333, after planarization of mounting layer 34. As illustrated in FIG. 9B, mounting layer 34 is planarized such that top surface 341 is substantially planar over an entire area thereof. Thus, planarized layer 35 and planed surface 351 are formed. As such, printhead dies 40 can be mounted on top surface 341 such that precise alignment between printhead dies 40 is achieved.

By disposing mounting layer 34 on top face 321 of substrate 32 and mechanically planarizing top surface 341 of mounting layer 34, a substantially planar surface for mounting printhead dies 40 is formed. Thus, printhead to printhead alignment is ensured. In addition, by having ink passages 323 and conductive paths 64 terminate with top face 321 of substrate 32, an integrity of ink passages 323 and conductive paths 64 is maintained as top surface 341 of mounting layer 34 is mechanically planarized. Furthermore, by providing openings 343 in mounting layer 34 which communicate with and reveal ink passages 323 and conductive paths 64, conductive paths 64 remain accessible from top surface 341 of mounting layer 34.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A method of forming an inkjet printhead assembly, the method comprising:

providing a substrate having a first face;

disposing a first planarization layer on the first face of the substrate, the first planarization layer having a first surface contacting the first face of the substrate and a second surface opposed to the first surface thereof;

mechanically planarizing the second surface of the first planarization layer, including reducing a thickness of at least a portion of the first planarization layer; and mounting a plurality of printhead dies on the second surface of the first planarization layer.

2. The method of claim 1, wherein mechanically planarizing the second surface of the first planarization layer includes forming a substantially planar surface over an entire area thereof.

3. The method of claim 1, wherein mechanically planarizing the second surface of the first planarization layer includes establishing a plurality of datum points for the printhead dies, each of the datum points lying in substantially one plane.

4. The method of claim 3, wherein mounting the printhead dies on the second surface of the first planarization layer includes contacting a number of the datum points.

5. The method of claim 1, wherein mechanically planarizing the second surface of the first planarization layer includes at least one of grinding and lapping the second surface of the first planarization layer.

6. The method of claim 1, wherein each of the printhead dies has a front face, and wherein mounting the printhead dies on the second surface of the first planarization layer includes aligning the front face of each of the printhead dies in substantially one plane.

7. The method of claim 6, wherein each of the printhead dies has a plurality of nozzle openings defined in the front face thereof, and wherein mounting the printhead dies on the second surface of the first planarization layer includes directing the nozzle openings substantially perpendicular to the second surface of the first planarization layer.

8. The method of claim 1, wherein the substrate includes a plurality of layers.

9. The method of claim 8, wherein at least one of the plurality of layers of the substrate is formed of a ceramic material.

10. The method of claim 8, wherein the plurality of layers of the substrate includes conductive layers and non-conductive layers, and wherein at least one of the non-conductive layers of the substrate and the first planarization layer are formed of the same material.

11. The method of claim 1, wherein the first planarization layer is formed of a ceramic material.

12. The method of claim 1, wherein the first planarization layer is formed of a non-metallic material.

13. The method of claim 1, further comprising:

forming a plurality of openings in the first planarization layer, each of the openings communicating with the first surface and the second surface of the first planarization layer.

14. The method of claim 13, wherein the substrate has a plurality of ink passages extending therethrough, at least one of the ink passages communicating with the first face of the substrate, and wherein at least one of the openings in the first planarization layer communicates with the at least one of the ink passages.

15. The method of claim 13, wherein the substrate includes a plurality of conductive paths extending therethrough, at least one of the conductive paths having an end communicating with the first face of the substrate, and wherein at least one of the openings in the first planarization layer reveals the end of the at least one of the conductive paths.

16. The method of claim 1, wherein the substrate has a second face opposed to the first face thereof, and further comprising:

disposing a second planarization layer on the second face of the substrate, the second planarization layer having a first surface contacting the second face of the substrate and a second surface opposed to the first surface thereof; and mechanically planarizing the second surface of the second planarization layer.

17. The method of claim 16, further comprising:

forming a plurality of openings in the second planarization layer, each of the openings communicating with the first surface and the second surface of the second planarization layer.

18. The method of claim 17, wherein the substrate has a plurality of ink passages extending therethrough, at least one of the ink passages communicating with the second face of the substrate, and wherein at least one of the openings in the second planarization layer communicates with the at least one of the ink passages.

19. The method of claim 17, wherein the substrate includes a plurality of conductive paths extending therethrough, at least one of the conductive paths having an end communicating with the second face of the substrate, and wherein at least one of the openings in the second planarization layer reveals the end of the at least one of the conductive paths.

20. An inkjet printhead assembly, comprising:

a substrate having a first face;

a first planarized layer disposed on the first face of the substrate, the first planarized layer having a first surface contacting the first face of the substrate and a mechanically planarized surface having a portion of reduced thickness opposed to the first surface thereof; and a plurality of printhead dies each mounted on the mechanically planarized surface of the first planarized layer, wherein the first planarized layer has a plurality of openings defined therein, each of the openings communicating with the first surface and the mechanically planarized surface of the first planarized layer.

21. The inkjet printhead assembly of claim 20, wherein the mechanically planarized surface of the first planarized layer is substantially planar over an entire area thereof.

22. The inkjet printhead assembly of claim 20, wherein the mechanically planarized surface of the first planarized layer establishes a plurality of datum points for the printhead dies, each of the datum points lying in substantially one plane.

23. The inkjet printhead assembly of claim 22, wherein each of the printhead dies contact a number of the datum points.

24. The inkjet printhead assembly of claim 20, wherein the mechanically planarized surface of the first planarized layer is at least one of a ground surface and a lapped surface.

25. The inkjet printhead assembly of claim 20, wherein each of the printhead dies has a front face, and wherein the front face of each of the printhead dies lies in substantially one plane.

26. The inkjet printhead assembly of claim 25, wherein each of the printhead dies has a plurality of nozzle openings defined in the front face thereof, and wherein the nozzle openings are directed substantially perpendicular to the mechanically planarized surface of the first planarization layer.

27. The inkjet printhead assembly of claim 20, wherein the substrate includes a plurality of layers.

28. The inkjet printhead assembly of claim 27, wherein at least one of the plurality of layers of the substrate is formed of a ceramic material.

29. The inkjet printhead assembly of claim 27, wherein the plurality of layers of the substrate includes conductive layers and non-conductive layers, and wherein at least one of the non-conductive layers of the substrate and the first planarized layer are formed of the same material.

30. The inkjet printhead assembly of claim 20, wherein the first planarized layer is formed of a ceramic material.

31. The inkjet printhead assembly of claim 20, wherein the first planarized layer is formed of a non-metallic material.

32. The inkjet printhead assembly of claim 20, wherein the substrate has a plurality of ink passages extending therethrough, at least one of the ink passages communicating with the first face of the substrate, and wherein at least one of the openings in the first planarized layer communicates with the at least one of the ink passages.

33. The inkjet printhead assembly of claim 20, further comprising:
a plurality of conductive paths extending through the substrate, at least one of the conductive paths having an end communicating with the first face of the substrate, and
wherein at least one of the openings in the first planarized layer reveals the at least one of the conductive paths.

34. The inkjet printhead assembly of claim 20, wherein the substrate has a second face opposed to the first face thereof, and further comprising:
a second planarized layer disposed on the second face of the substrate, the second planarized layer having a first surface contacting the second face of the substrate and a mechanically planarized surface opposed to the first surface thereof.

35. The inkjet printhead assembly of claim 34, wherein the second planarized layer has a plurality of openings defined therein, each of the openings communicating with the first surface and the mechanically planarized surface of the second planarized layer.

36. The inkjet printhead assembly of claim 35, wherein the substrate has a plurality of ink passages extending therethrough, at least one of the ink passages communicating with the second face of the substrate, and wherein at least one of the openings in the second planarized layer communicates with the at least one of the ink passages.

37. The inkjet printhead assembly of claim 35, further comprising:
a plurality of conductive paths extending through the substrate, at least one of the conductive paths having an end communicating with the second face of the substrate and wherein at least one of the openings in the second planarized layer reveals the at least one of the conductive paths.

38. A carrier adapted to receive a plurality of printhead dies each having a plurality of electrical contacts, the carrier comprising:
a planarized layer including a planarized surface having a portion of reduced thickness adapted to provide mechanical support for the printhead dies; and
a metallized layer defining a plurality of electrical contacts accessible from the planarized surface of the planarized layer and configured for electrical coupling to corresponding ones of the electrical contacts of the printhead dies.

39. The carrier of claim 38, wherein the planarized layer has a plurality of ink openings defined therein, each of the ink openings adapted to provide a passage for ink to a corresponding one of the printhead dies.

40. An inkjet printhead assembly, comprising:
a substrate having a first face;
a first planarized layer disposed on the first face of the substrate, the first planarized layer having a first surface contacting the first face of the substrate and a mechanically planarized surface opposed to the first surface thereof, and
a plurality of printhead dies each mounted on the mechanically planarized surface of the first planarized layer,
wherein the mechanically planarized surface reduces a thickness of at least a portion of the first planarized layer.

41. The inkjet printhead assembly of claim 40, wherein the mechanically planarized surface of the first planarized layer is substantially planar over an entire area thereof.

42. The inkjet printhead assembly of claim 40, wherein the mechanically planarized surface of the first planarized layer establishes a plurality of datum points for the printhead dies, each of the datum points lying in substantially one plane.

43. The inkjet printhead assembly of claim 42, wherein each of the printhead dies contact a number of the datum points.

44. The inkjet printhead assembly of claim 40, wherein the mechanically planarized surface of the first planarized layer is at least one of a ground surface and a lapped surface.

45. The inkjet printhead assembly of claim 40, wherein each of the printhead dies has a front face, and wherein the front face of each of the printhead dies lies in substantially one plane.

46. The inkjet printhead assembly of claim 45, wherein each of the printhead dies has a plurality of nozzle openings defined in the front face thereof, and wherein the nozzle openings are directed substantially perpendicular to the mechanically planarized surface of the first planarization layer.

47. The inkjet printhead assembly of claim 40, wherein the substrate includes a plurality of layers.

48. The inkjet printhead assembly of claim 47, wherein at least one of the plurality of layers of the substrate is formed of a ceramic material.

49. The inkjet printhead assembly of claim 47, wherein the plurality of layers of the substrate includes conductive layers and non-conductive layers, and wherein at least one of the non-conductive layers of the substrate and the first planarized layer are formed of the same material.

50. The inkjet printhead assembly of claim 40, wherein the first planarized layer is formed of a ceramic material.

51. The inkjet printhead assembly of claim 40, wherein the first planarized layer is formed of a non-metallic material.

52. The inkjet printhead assembly of claim 40, wherein the substrate has a second face opposed to the first face thereof, and further comprising:

a second planarized layer disposed on the second face of the substrate, the second planarized layer having a first surface contacting the second face of the substrate and a mechanically planarized surface opposed to the first surface thereof.

* * * * *